(12) United States Patent
Kanbe

(10) Patent No.: US 7,840,388 B2
(45) Date of Patent: Nov. 23, 2010

(54) ENGINEERING DEVICE

(75) Inventor: Takahiro Kanbe, Musashino (JP)

(73) Assignee: Yokogawa Electric Corporation, Tokyo (JP)

( * ) Notice: Subject to any disclaimer, the term of this patent is extended or adjusted under 35 U.S.C. 154(b) by 725 days.

(21) Appl. No.: 11/821,268

(22) Filed: Jun. 22, 2007

(65) Prior Publication Data

US 2008/0010042 A1    Jan. 10, 2008

(30) Foreign Application Priority Data

| Jun. 26, 2006 | (JP) | ............................ 2006-175546 |
| Jun. 26, 2006 | (JP) | ............................ 2006-175547 |
| Jun. 26, 2006 | (JP) | ............................ 2006-175548 |

(51) Int. Cl.
*G06F 17/50* (2006.01)

(52) U.S. Cl. .......................................... 703/1; 345/636

(58) Field of Classification Search ................... 703/1, 703/2, 6, 22; 707/100; 345/467, 636
See application file for complete search history.

(56) References Cited

U.S. PATENT DOCUMENTS

| 5,204,821 | A  | * | 4/1993  | Inui et al. ................... 700/106 |
| 6,205,365 | B1 | * | 3/2001  | Inada .......................... 700/96 |
| 6,959,320 | B2 | * | 10/2005 | Shah et al. ................... 709/203 |
| 7,053,898 | B2 | * | 5/2006  | Yonemura et al. ........... 345/467 |
| 7,265,756 | B2 | * | 9/2007  | Schneider et al. ........... 345/440 |
| 2004/0220684 | A1 |  | 11/2004 | Fukui |
| 2004/0249809 | A1 | * | 12/2004 | Ramani et al. ................. 707/4 |
| 2005/0171965 | A1 | * | 8/2005  | Fujimoto et al. ............ 707/100 |

FOREIGN PATENT DOCUMENTS

| JP | 11-96057   | A  | 4/1999 |
| JP | 11-202908  |    | 7/1999 |
| JP | 2004-46585 | A  | 2/2004 |
| JP | 2004-303217 | A  | 10/2004 |
| JP | 2005-227971 | A  | 8/2005 |
| WO | WO-03/079139 | A2 | 9/2003 |

OTHER PUBLICATIONS

Altium Tutorials: "Creating a Core Component," XP-002460969, pp. 1-9 (2005).
Altium Tutorials: "Welcome to the Altium Designer Environment," XP-002460970, pp. 1-39 (2005).
Myung, et al., "Knowledge-Based Parametric Design of Mechanical Products Based on Configuration Design Method," XP-002264161, 21:99-107 (2001).
Ma, et al., "Standard Component Library Design and Implementation for Plastic Injection Mold Design with a CAD Tool," XP-010894359 pp. 981-985 (2003).
Ma, et al., "Associative Assembly Design Features: Concept, Implementation and Application," XP-019488086, 32:434-444 (2006).
Valášek, et al., "Concept of Computer Aided Internal Combustion Engine Design at Configuration Level," XP-007903595, pp. 321-332 (2001).
Aspettati, et al., "Parametric and Feature-Based Assembly in Motorcycle Design: From Preliminary Development to Detail Definition," XP-002461002, pp. D3-1-D3-10 (2001).
European Search Report dated Dec. 20, 2007.
Japanese Office Action dated Mar. 26, 2010, issued in corresponding Japanese Patent Application No. 2006-175546.
Japanese Office Action dated Jun. 15, 2010, issued in corresponding Japanese Patent Application No. 2006-175547.
Japanese Office Action dated Jun. 17, 2010, issued in corresponding Japanese Patent Application No. 2006-175546.

* cited by examiner

*Primary Examiner*—Russell Frejd
(74) *Attorney, Agent, or Firm*—Westerman, Hattori, Daniels & Adrian, LLP

(57) ABSTRACT

An engineering device includes a drawing builder for generating a general-purpose part formed by combining functional parts, and a general-purpose part managing section for registering the general-purpose part thus generated in a database and quoting the general-purpose part thus registered in the drawing builder to utilize as a general-purpose part object. The engineering device further includes a reuse section for referring to a general-purpose part object, an operation thereof having been confirmed, within a drawing builder and registers the general-purpose part object in the general-purpose part management section.

6 Claims, 10 Drawing Sheets

FIG. 6

DISPLAY SCREEN OF COLLECTIVE UPDATING MANAGEMENT SECTION — 2100a

| ALL FOLDERS | SELECTED FOLDER: DR0001 | | |
|---|---|---|---|
| | OBJECT NAME | TYPE | UPDATED DATE |
| ☐ ☑ PJT01 | | | |
|   ⊞ ☑ FCS1601 | ☑ OBJ-1 | TYP001 | 2006/01/18 13:26 |
|   ⊞ ☑ FCS1609 | ☑ OBJ-2 | TYP002 | 2005/07/01 17:45 |
|   ☐ ☑ FCS1663 | ☐ OBJ-3 | TYP003 | 2006/01/18 13:27 |
|     ☐ ☑ DR0001 | ☑ OBJ-4 | TYP004 | 2006/01/18 13:27 |
|     ☐ ☑ DR0002 | | | |
|     ☐ ☐ DR0003 | | | |

ENGINEERING DEVICE

This application claims priorities from Japanese Patent Application No. 2006-175548, filed Jun. 26, 2006, Japanese Patent Application No. 2006-175547, filed Jun. 26, 2006 and Japanese Patent Application No. 2006-175546, filed Jun. 26, 2006, in the Japanese Patent Office. The priority applications are incorporated by reference in its entirety.

TECHNICAL FIELD

The present disclosure relates to an engineering device which includes a drawing builder for generating a general-purpose part formed by combining functional parts, and a general-purpose part managing section for registering the general-purpose part thus generated in a general-purpose part database and quoting the general-purpose part thus registered in the drawing builder to utilize as a general-purpose part object.

FIG. 7 is a functional block diagram showing an example of the configuration of an engineering device of a related art which is coupled to a distributed type control system.

An operation monitor device 1 of the distributed type control system is coupled to a control bus 2. Each of control devices 31, 32, - - - 3n is coupled to the control bus 2 thereby to communicate with the operation monitor device 1. The control devices include application databases 41, 42, - - - 4n each of which holds a control application downloaded from a host device.

Each of the control devices, when showing the control device 31 as a representative example, communicates with devices 61, 62, - - - 6n of a plant 6 via a field bus 5 and executes the control application to control these devices.

An engineering device 7 is coupled to the control bus 2 and functions together with the operation monitor device 1 as a host device of the control device 31, 32, - - - 3n. As the basic functions, the engineering device 7 has a function of generating control application programs to be executed in the control device 31, 32, - - - 3n and downloading the programs in the respective control devices and a function of generating a GUI program run on the operation monitor device 1 and downloading the GUI program in the operation monitor device 1.

Hereinafter, the function of generating the control application program and downloading the program in the respective control devices will be explained. A drawing builder 71 having an edit function for generating the control application programs is configured by a plurality of drawing builders DR-1, DR-2, - - - DR-n in correspondence to the control devices 31, 32, - - - 3n, respectively.

Hereinafter, the function of the drawing builder 71 will be explained as to DR-1 as a representative example. The engineering device 7 generates a processing unit of the control as functional part in advance by a functional part generation section 72 and registers the functional part in a functional part library 73 and holds therein.

The drawing builder 71 combines and edits a plurality of the functional parts with reference to the functional part library 73 to obtain a general-purpose part having a predetermined control function (for example, a PID calculation processing function), then sends the general-purpose part thus obtained to a general-purpose part management section 74 and registers in a general-purpose part database 75.

The general-purpose part registered in the general-purpose part database 75 is quoted by the drawing builder 71 via the general-purpose part management section 74 and used as an original data for preparing another general-purpose part.

The general-purpose part registered in the general-purpose part database 75 and thus quoted is shown as ORG-1. A plurality of general-purpose parts which are prepared by quoting the general-purpose part ORG-1 by the drawing builder DR-1 are shown as general-purpose part objects OBJ-1, OBJ-2, - - - OBJ-N.

These general-purpose part objects will be the control application programs downloaded in the application database 41 of the control device 31. The relation between the general-purpose part objects on the other drawing builders DR-2, - - - DR-n and the application databases 42, - - - 4n of the control devices 32, - - - 3n is same as the aforesaid relation.

The editing contents of the drawing builders DR-1, DR-2, - - - DR-n is held in an engineering database 76. By referring to data previously updated and backed up by a backup database 77, the engineering database 76 obtains a difference between the editing contents and the previously updated data, and the difference data is downloaded in the application databases 41, 42, - - - 4n of the control devices 31, 32 - - - 3n via a download process section 78.

There is a demand of reusing, on another drawing builder, a general-purpose part object having been operated at a control loop already running on a control device in which the object is downloaded.

As a method of related art for the demand of such a reuse, a method is generally employed in which a general-purpose part object required to be reused, for example, the general-purpose part object OBJ-1 of the drawing builders DR-1 is copied by a copying section 79 and the general-purpose part object thus copied is pasted on the drawing builders DR-n at which the object is reused. FIG. 8 is an image diagram showing a reuse mode of the related art of the general-purpose part object using the copying method of the related art.

Japanese Patent Unexamined Publication No. 11-202908 describes a control drawing device using a control drawing which defines a set of controls configured by a plurality of functional blocks.

The collective updating of the related art has the following problems.

(1) The control loop using the copied general-purpose part object is required to perform an operation test like another function block after the engineering. That is, the reuse technique using the copying method can not contribute to the reduction of the number of a test.

(2) When the general-purpose part object to be copied is changed, all the general-purpose part objects of a copy destination reusing the copy are required to be prepared again. That is, the copying method can not contribute to the reduction of the processing number of the engineering.

In the case where the general-purpose part object is prepared on the drawing builder by quoting a general-purpose part which is registered in the general-purpose part management database 75 and generally utilized, it is necessary to perform a peculiar setting, for example, data setting such as a tag name to the general-purpose part object thus prepared at a location where the object is actually used.

The engineering device 7 further includes a general-purpose part edit section 179 (FIG. 9), and the general-purpose part edit section 179 is activated from the drawing builder and executes to set a peculiar data to the general-purpose part object generated on the drawing builder. The general-purpose part edit section 179 obtains, from the general-purpose part management section 74, information of the edit item of function blocks constituting the general-purpose part object to be edited.

The edit function of the general-purpose part object of the related art has the following problems.

(1) Data of an item not required to be edited may be erroneously edited. Even if a reliable general-purpose part object is prepared by performing an operation test etc., when unnecessary data irrelevant to the intention of a preparer is edited by an engineer, the effectiveness of reuse and the reliability of a general-purpose part itself may be lost.

(2) In the case of utilizing a general-purpose part, when all data can be edited on a general-purpose part object, it is difficult for an engineer to determine data to be edited. Thus, it is required to pay minute attention to an item to be edited, and this fact results in the reduction of reliability of the engineering due to editing mistake.

The engineering device 7 further includes a general-purpose part edit section 279 (FIG. 10), and the general-purpose part edit section 279 is activated by the general-purpose part management section 74 and sets the change of the data of a functional block constituting the general-purpose part, for example ORG-1, registered in the general-purpose part database 75. This setting change is reflected on all the general-purpose part objects OBJ-1, OBJ-2, - - - OBJ-N quoting the ORG-1 on the drawing builder.

The data of the general-purpose part objects on the drawing builder 71 is sent to the engineering database 76 by using a collective updating function periodically or at every edition of the general-purpose part, and differences from the previously updated data are collectively downloaded on the control device side.

The collective updating of the related art has the following problems.

(1) A general-purpose part object is downloaded in a control device and operates as a control application program for controlling the devices of a plant. In the control devices etc. being operated, it is supposed that there may be a control loop in which the operation is desired to be continued as it is without changing a program even if a general-purpose part being quoted changes.

(2) There is a need that, the collective updating is performed in a divided manner on the control device unit basis. According to the collective updating of the related art, since all the general-purpose part objects on a drawing builder are collectively updated, it is impossible to restrict the collective updating depending on a circumstances.

SUMMARY

Exemplary embodiments of the present invention provide an engineering device which can automatically reflect the information of a general-purpose part object to be reused on a general-purpose part object which is being reused.

Further, exemplary embodiments of the present invention provide an engineering device which has a function of allowing only an item capable of being edited in a general-purpose part object at every general-purpose part.

Further, exemplary embodiments of the present invention provide an engineering device which, when a general-purpose part has been edited, can set the allowance of updating at every general-purpose part object on a drawing builder quoting the general-purpose part edited.

The exemplary embodiments of the present invention have the following configuration.

(1) An engineering device comprises a drawing builder for generating a general-purpose part formed by combining functional parts, a general-purpose part managing section for registering the general-purpose part thus generated in a database and quoting the general-purpose part thus registered in the drawing builder to utilize as a general-purpose part object, and a reuse section for referring to a general-purpose part object, an operation thereof having been confirmed, within a drawing builder and registers the general-purpose part object in the general-purpose part management section.

(2) An engineering device described in the aforesaid (1), wherein the reuse section includes a user interface in which a registration is completed by dragging and dropping, to the general-purpose part managing section displayed on a screen, the general-purpose part object to be reused on a drawing builder displayed on the screen.

(3) An engineering device described in the aforesaid (2), wherein the general-purpose part management section pastes the general-purpose part object thus registered by the reuse section, on a drawing builder at which the object is reused.

(3) An engineering device described in one of the aforesaid (1) to (3), wherein a plurality of the drawing builders are provided in correspondence to control devices of a distributed type control system, and the general-purpose part object on the drawing builder is downloaded in a database of a corresponding one of the control devices as an application program executed on the corresponding control device.

Based on aforesaid explanation, the exemplary embodiments of the present invention have the following effects.

(1) When a general-purpose part object having been operated is registered as a general-purpose part and quoted in a drawing builder which uses the general-purpose part, it is not necessary to perform an operation test after the engineering in a control loop in which the general-purpose part object is downloaded. Thus, the present invention can contribute to the reduction of the number of tests.

(2) When a general-purpose part to be quoted is changed, since the change is reflected on all the general-purpose part objects being reused, it is not necessary to prepare each of the general-purpose part objects again. Thus, the present invention can contribute to the reduction of the amount of engineering processing.

Further, the exemplary embodiments of the present invention have the following configuration.

(1) An engineering device comprises a drawing builder for generating a general-purpose part formed by combining functional parts, a general-purpose part managing section for registering the general-purpose part thus generated in a database and quoting the general-purpose part thus registered in the drawing builder to utilize as a general-purpose part object, a general-purpose part object edit section for editing the registered general-purpose part object on the drawing builder, and an edit management section for setting, with respect to the general-purpose part managing section, allowance of editing at each edit item provided in the registered general-purpose part.

(2) An engineering device described in the aforesaid (1), wherein the edit management section includes a user interface for inputting via a screen a setting of the edit allowance at each item provided at a function block displayed hierarchically at a lower rank of the general-purpose part being displayed.

(3) An engineering device described in the aforesaid (2), wherein the general-purpose part object edit section displays on the screen only edit data of an item allowed to be edited by the edit management section.

(3) An engineering device described in one of the aforesaid (1) to (3), wherein a plurality of the drawing builders are provided in correspondence to control devices of a distributed type control system, and the general-purpose part object on the drawing builder is downloaded as an application program executed on the corresponding control device.

Based on aforesaid explanation, the exemplary embodiments of the present invention have the following effects.

(1) An engineer preparing a general-purpose part can selectively manage the edit item subject to the engineering in the general-purpose part object being quoted, so that the reliability of the general-purpose part can be improved.

(2) A user, who performs the engineering on the drawing builder with respect to the general-purpose part object utilizing the general-purpose part, can edit only the item allowed at each the general-purpose part, the provability of a mistake such as an erroneous edit or the omission of the edit of an item required to be edited can be reduced. Thus, the reliability of the engineering can be improved.

Further, the exemplary embodiments of present invention have the following configuration.

(1) An engineering device comprises a drawing builder for generating a general-purpose part formed by combining functional parts, a general-purpose part managing section for registering the general-purpose part thus generated in a database and quoting the general-purpose part thus registered in the drawing builder to utilize as a general-purpose part object, a general-purpose part edit section for editing the registered general-purpose part, and a collective updating management section which sets, with respect to the general-purpose part managing section, allowance of updating at every general-purpose part object utilized on the drawing builder.

(2) An engineering device described in the aforesaid (1), wherein the collective updating management section includes a user interface for inputting via a screen a setting of the updating allowed at each the general-purpose part object displayed hierarchically at a lower rank of the drawing builder being displayed.

(3) An engineering device described in the aforesaid (1) or (2), wherein the general-purpose part objects on the drawing builder are updated collectively.

(4) An engineering device described in one of the aforesaid (1) to (3), wherein a plurality of the drawing builders are provided in correspondence to control devices of a distributed type control system, and the general-purpose part object on the drawing builder is downloaded in a database of a corresponding one of the control devices as an application program executed on the corresponding control device.

Based on aforesaid explanation, the exemplary embodiments of the present invention have the following effects.

(1) A user can set to selectively allow the collective updating as to arbitrary one or ones of the general-purpose part objects on the drawing builder. Thus in the control device being operated, the operation can be continued as it is without changing a control loop.

(2) It is possible to realize an engineering in which the collective updating is desired to be performed in a divided manner on the control device unit basis.

Other features and advantages may be apparent from the following detailed description, the accompanying drawings and the claims.

BRIEF DESCRIPTION OF THE DRAWINGS

FIG. 6 is an image diagram of the display screen of a collective updating management section.

DETAILED DESCRIPTION

Figure 1:
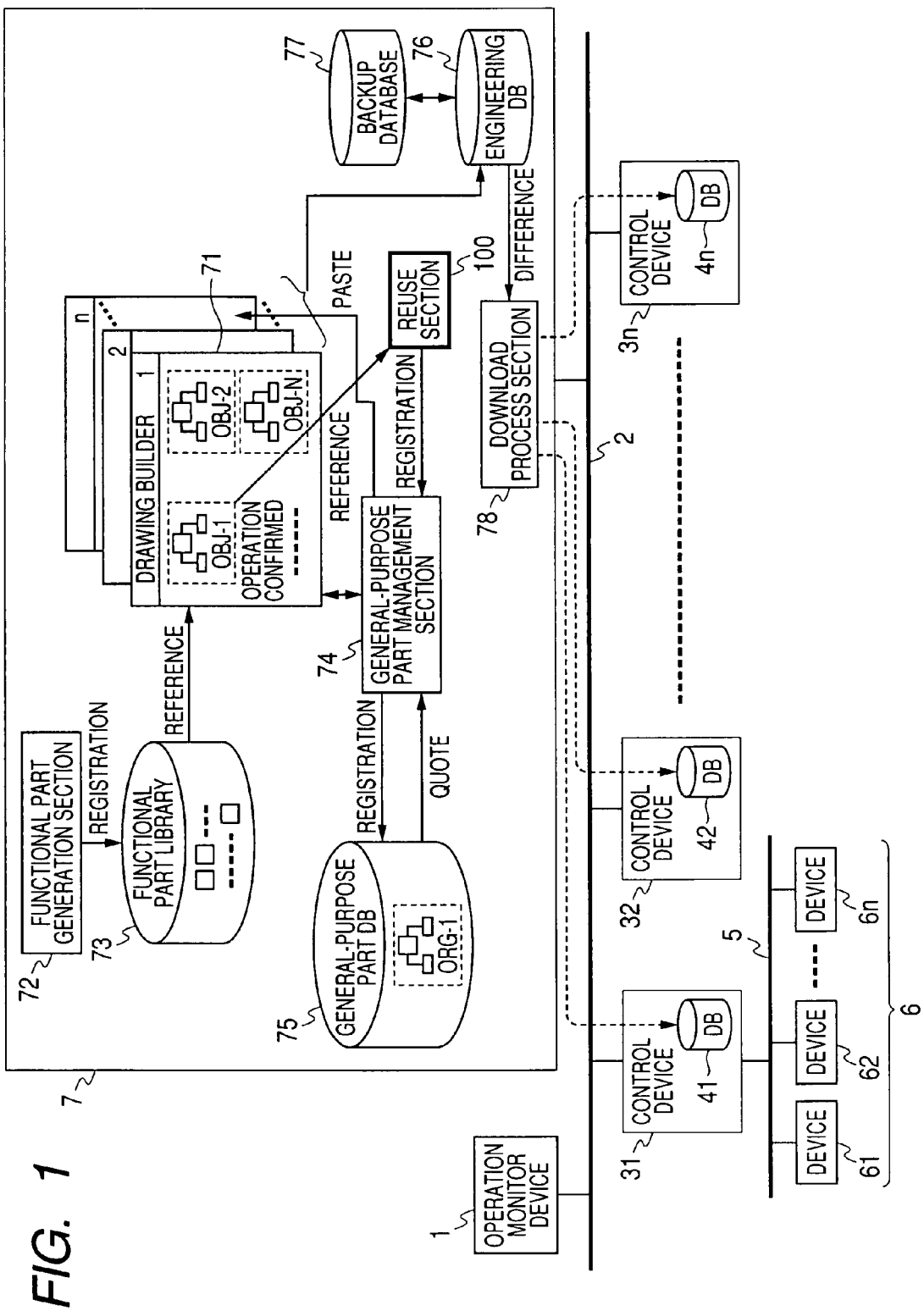
FIG. 1 is a functional block diagram showing a first exemplary embodiment of an engineering device according to the present invention which is coupled to a distributed type control system.
Figure 7:
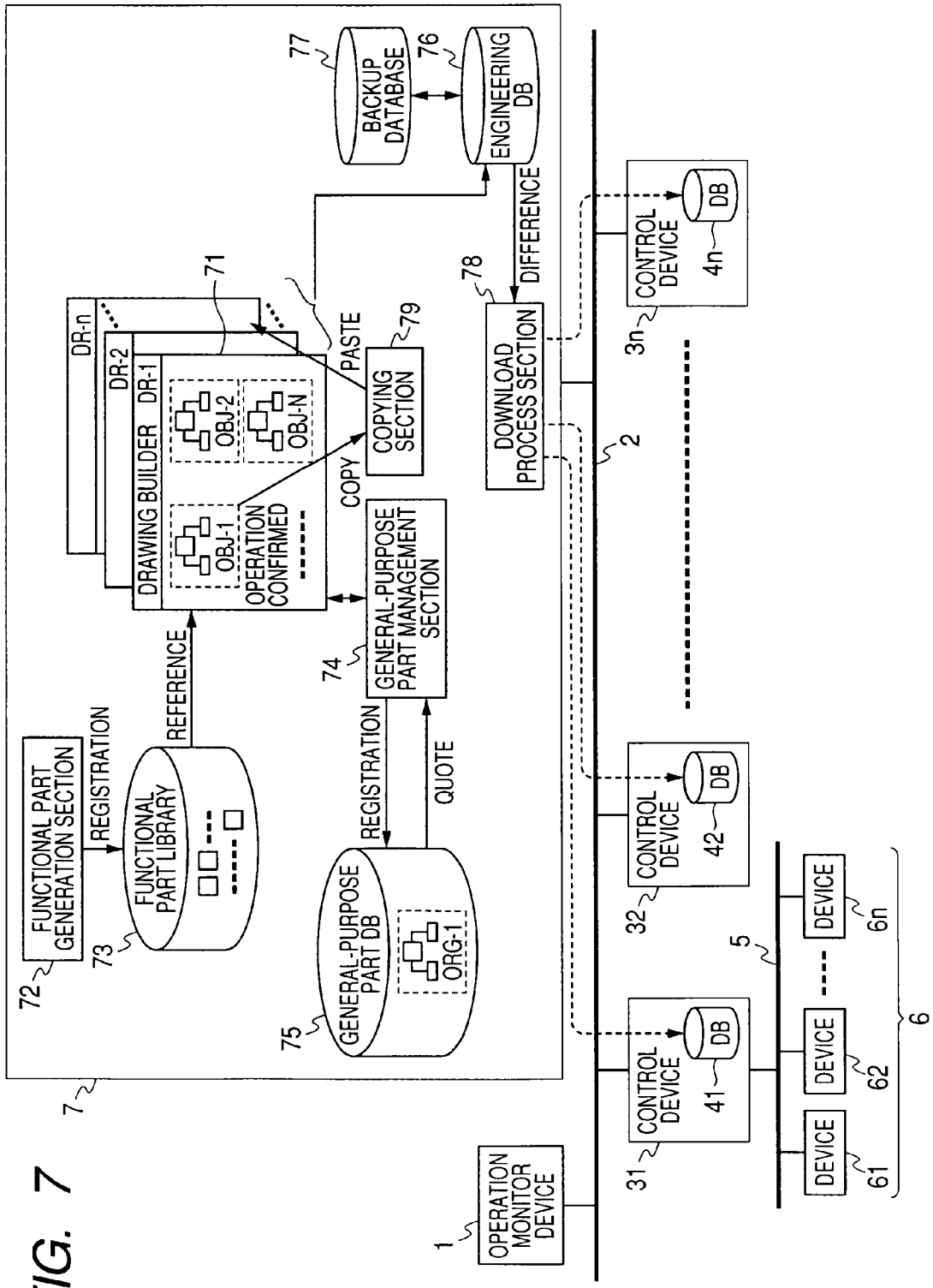
FIG. 7 is a functional block diagram showing an example of the configuration of an engineering device of a related art which is coupled to a distributed type control system.
Figure 8:
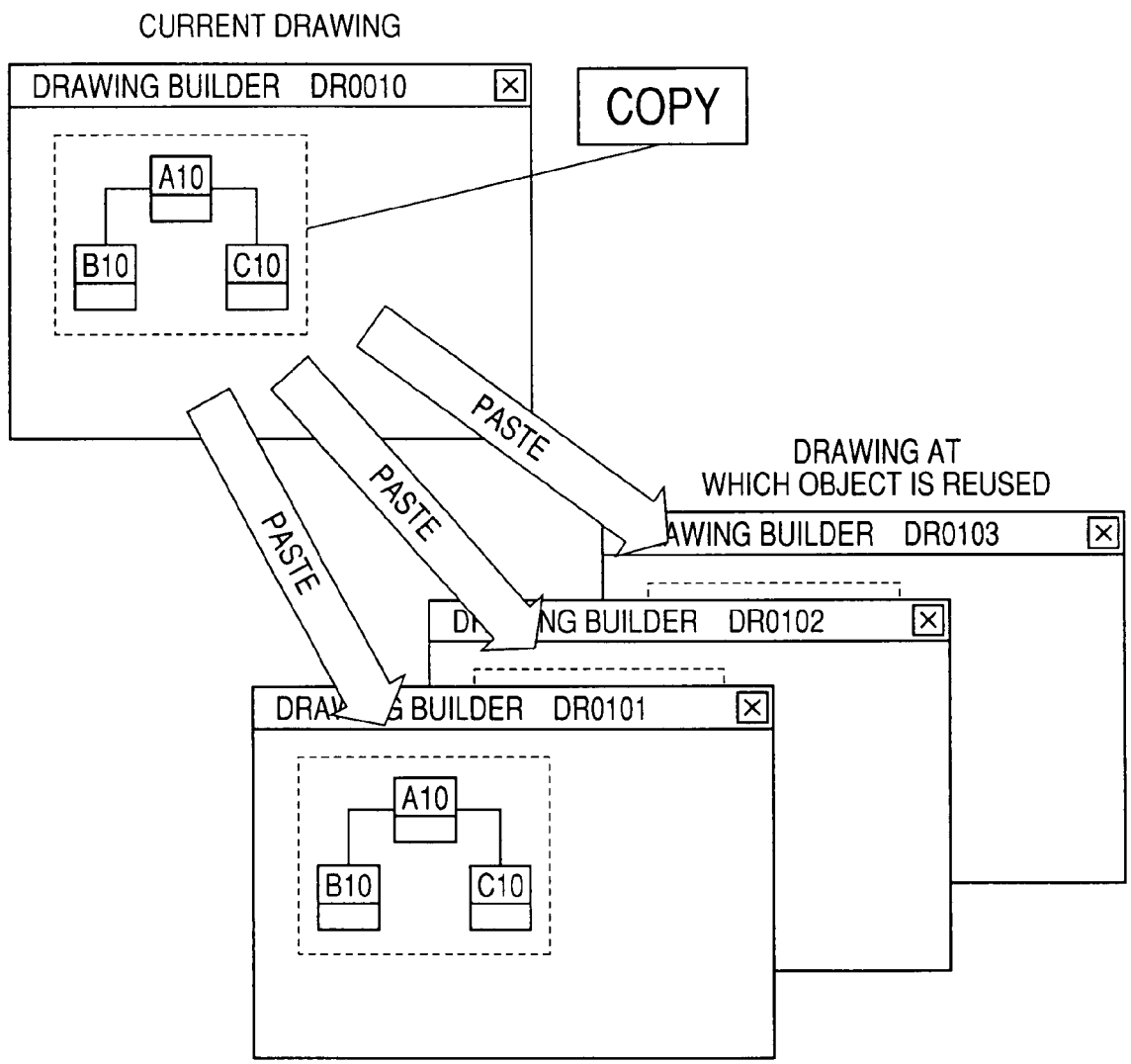
FIG. 8 is an image diagram showing a reuse mode using a copying method of a related art of a general-purpose part object.

Hereinafter, exemplary embodiments of the present invention will be explained in detail with reference to drawings. FIG. 1 is a functional block diagram showing a first exemplary embodiment of an engineering device according to the present invention which is coupled to a distributed type control system. In the figure, portions identical to those of FIG. 7 are referred to by the common symbols, with explanation thereof being omitted.

The characterizing portion of the first embodiment of the present invention is a reuse section 100 shown by a block of a thick line. The reuse section refers to a general-purpose part object, the operation thereof having been confirmed, on a drawing builder 71 and registers the general-purpose part object in a general-purpose part management section 74.

Figure 2:
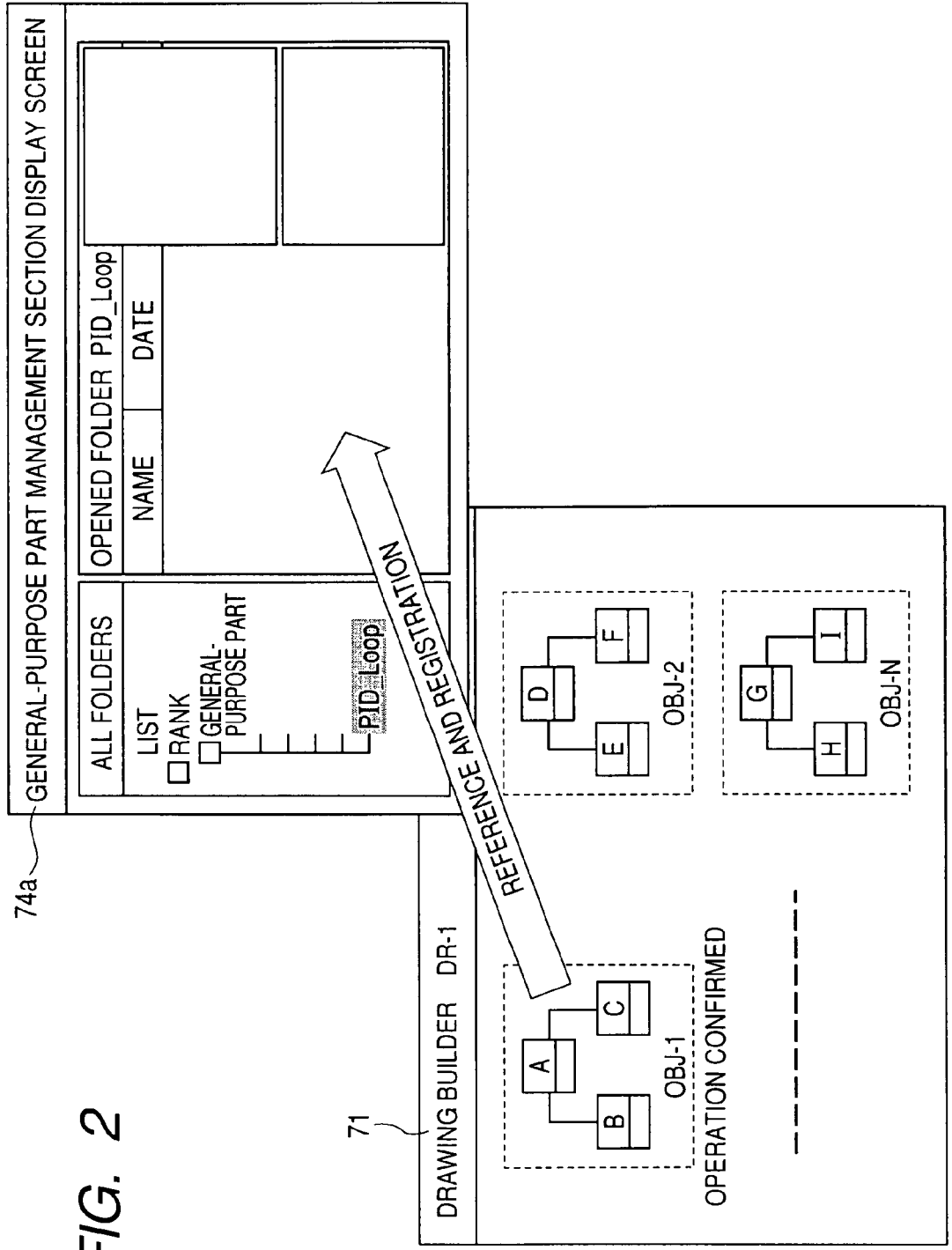
FIG. 2 is an image diagram of a screen operation using a reuse section as to the reference and registration of a general-purpose part object the operation of which has been confirmed

FIG. 2 is an image diagram of a screen operation using the reuse section 100 as to the reference and registration of a general-purpose part object the operation of which has been confirmed. The reuse section 100 is not displayed and has a user interface in which the registration is completed by dragging and dropping, on the display screen 74a of the general-purpose part management section 74, a general-purpose part object OBJ-1 to be reused on a drawing builder DR-1 displayed on the screen.

At the left pane of the general-purpose part management section display screen 74a, a list of general-purpose parts being registered are displayed hierarchically. The folder of a general-purpose part desired to be registered, for example, PID Loop shown by a hatching is selected via the reuse section 100 to open the folder at the right pane, and the general-purpose part object OBJ-1 of the drawing builder DR-1 is dragged and dropped on an are of the opened folder.

The general-purpose part management section 74 pastes the general-purpose part object OBJ-1 thus registered by the reuse section 100 on a drawing builder at which the object is reused.

Figure 3:
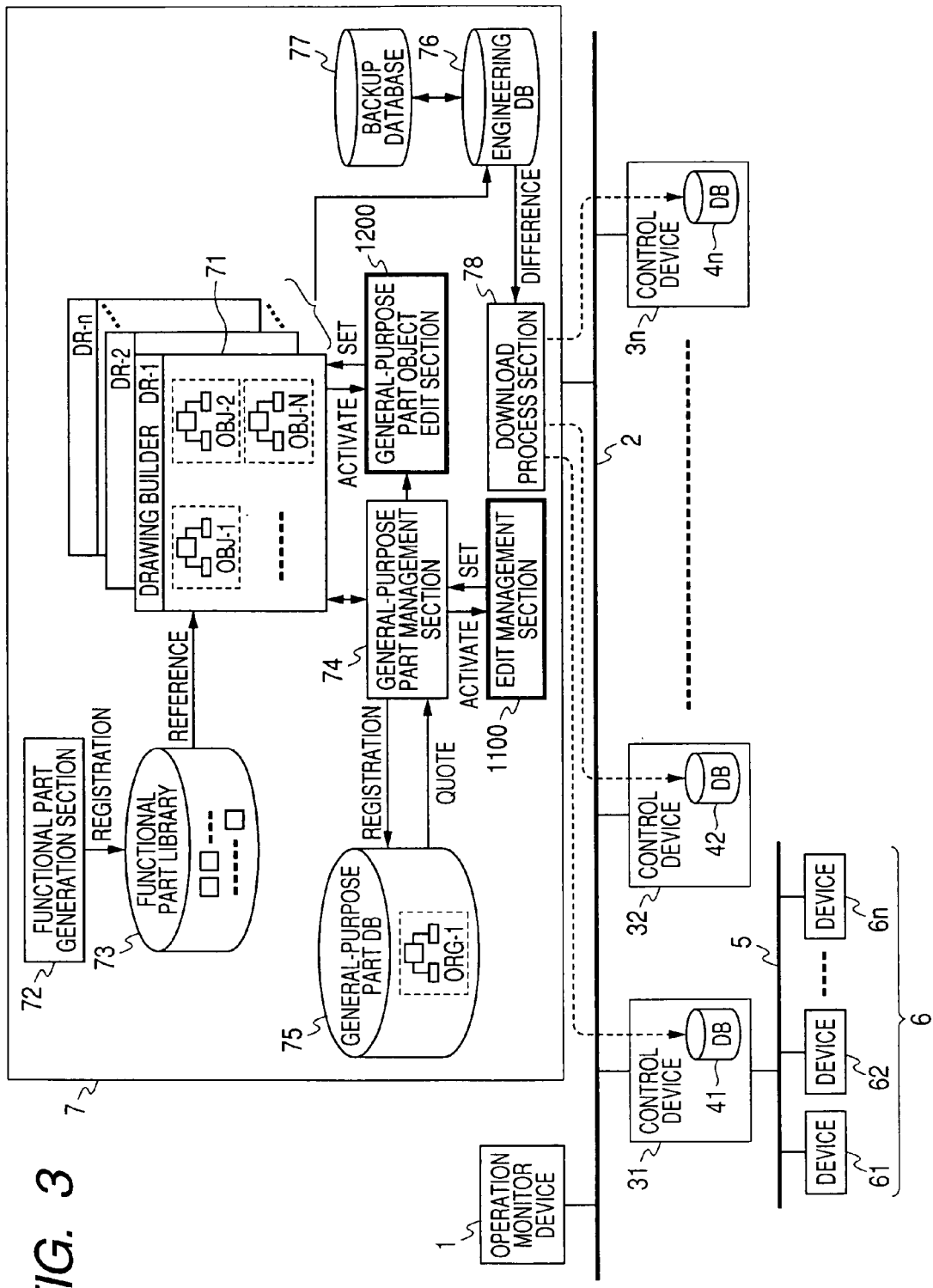
FIG. 3 is a functional block diagram showing a second exemplary embodiment of an engineering device according to the present invention which is coupled to a distributed type control system.
Figure 9:
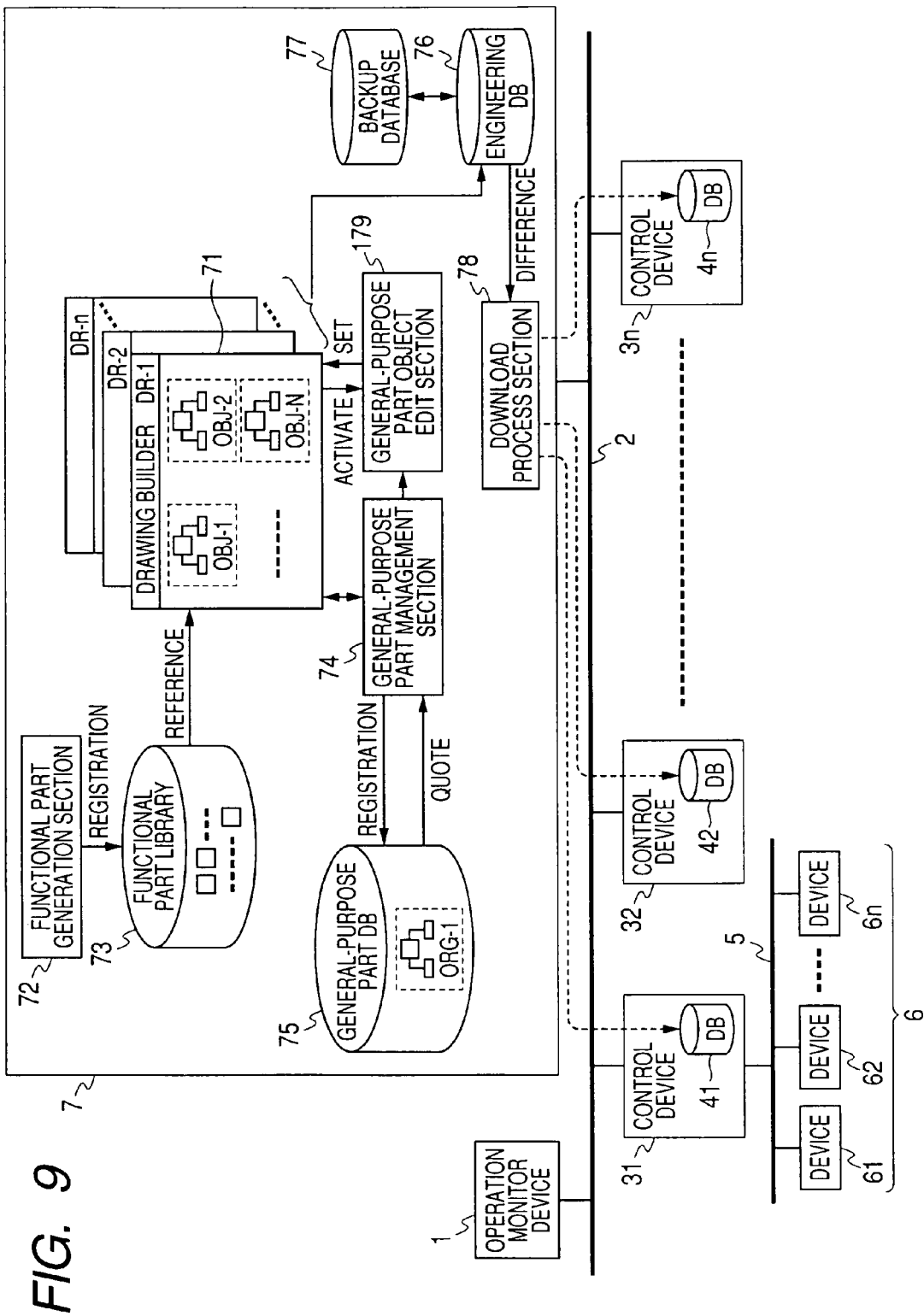
FIG. 9 is a functional block diagram showing an example of the configuration of an engineering device of a related art which is coupled to a distributed type control system.

Next, FIG. 3 is a functional block diagram showing a second exemplary embodiment of an engineering device according to the present invention which is coupled to a distributed type control system. In the figure, portions identical to those of FIG. 9 are referred to by the common symbols, with explanation thereof being omitted.

The characterizing portion of the second embodiment of the present invention are an edit management section 1100 and a general-purpose part object edit section 1200 each shown by a block of a thick line. The basic function of the general-purpose part object edit section 1200 is same as the general-purpose part edit object section 179 explained with reference to FIG. 9 and so the general-purpose part object edit section 1200 edits the peculiar data of a general-purpose part object quoted by a drawing builder 71.

The edit management section 1100 is started with an edit mode when a general-purpose part object to be edited is designated on the display screen of the general-purpose part management section 74. All items capable of being edited are displayed on the display screen of the edit management section 1100 and a setting for allowing the edit at each item can be inputted via the screen.

Figure 4:
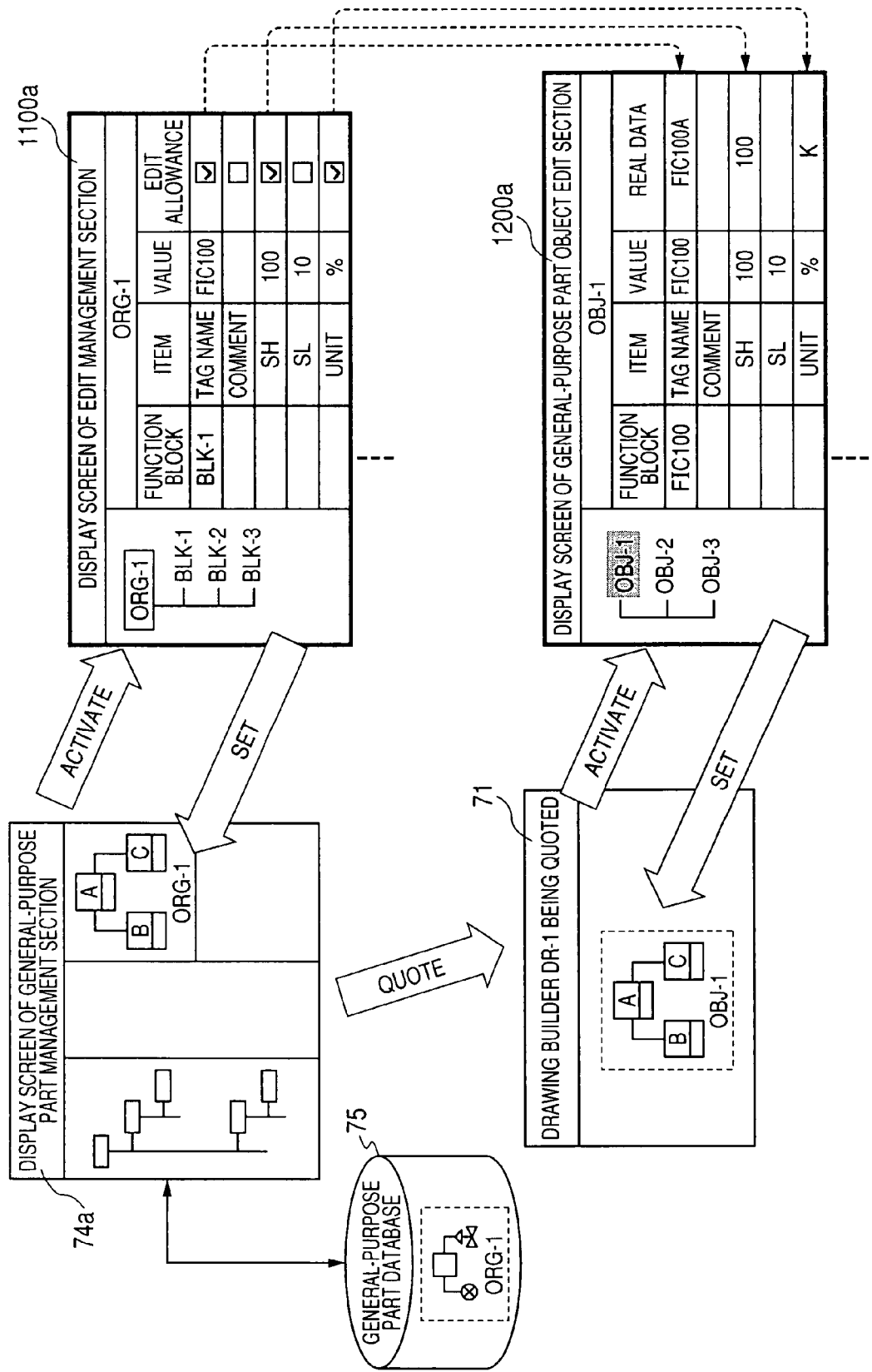
FIG. 4 is an image diagram of display screens for explaining the relation of the settings of an edit management section and the general-purpose part object edit section according to the present invention.

FIG. 4 is an image diagram of the display screens for explaining the relation of the settings of the edit management section 1100 and the general-purpose part object edit section 1200. The display screen 1100a of the edit management section 1100 with respect to a general-purpose part ORG-1 to be edited is activated when the general-purpose part ORG-1 shown hierarchically is selected and double-clicked by a mouse.

At the left pane of a display screen 1100a of the edit management section 1100 having been activated, function blocks BLK-1, BLK-2, BLK-3 constituting the general-purpose part ORG-1 are displayed hierarchically. At the right pane, the detailed data of the editable items of each of the function blocks is displayed.

Further, at the right pane, a check box for inputting via the screen the allowance of the edit at each of the editable items. When the check box is set to ON, the data editing of the corresponding item is allowed on the drawing builder.

In a state where the setting for the general-purpose part ORG-1 has been executed, when the general-purpose part object OBJ-1 on the drawing builder DR-1 is designated and activated, a display screen 1200a of the general-purpose part object edit section 1200 is displayed. In the figure, at the left pane, the general-purpose part object on the drawing builder DR-1 is displayed. OBJ-1 shown by a hatching is the general-purpose part object to be edited.

At the right pane of the display screen 1200a, of a plurality of edit items of the function blocks constituting the general-purpose part object OBJ-1 to be edited, the edit data concerning only the edit items allowed to be edited is displayed. Data of the remaining edit items is masked and so not displayed.

In the display example of FIG. 4, of the edit items of the function block BLK-1 of the general-purpose part ORG-1, the edit of each of tag name, upper limit value SH and UNIT (data unit) is allowed by the ON setting of the check boxes. Thus, in the display screen 1200a for the editing of the general-purpose part object, the edit data of FIC100, 100 and % are displayed at a value column in corresponding to the tag name, the upper limit value SH and the UNIT of an item column, respectively.

A user can edit these data. In this example, actual data is set via the screen in a manner that the tag name is changed from FIC100 to FIC100A, SH is kept to 100, and UNIT is changed from the unit of % to the unit of K (absolute temperature). As to the remaining edit items, since the values are masked and not displayed, the setting of the actual data can not be performed.

Figure 5:
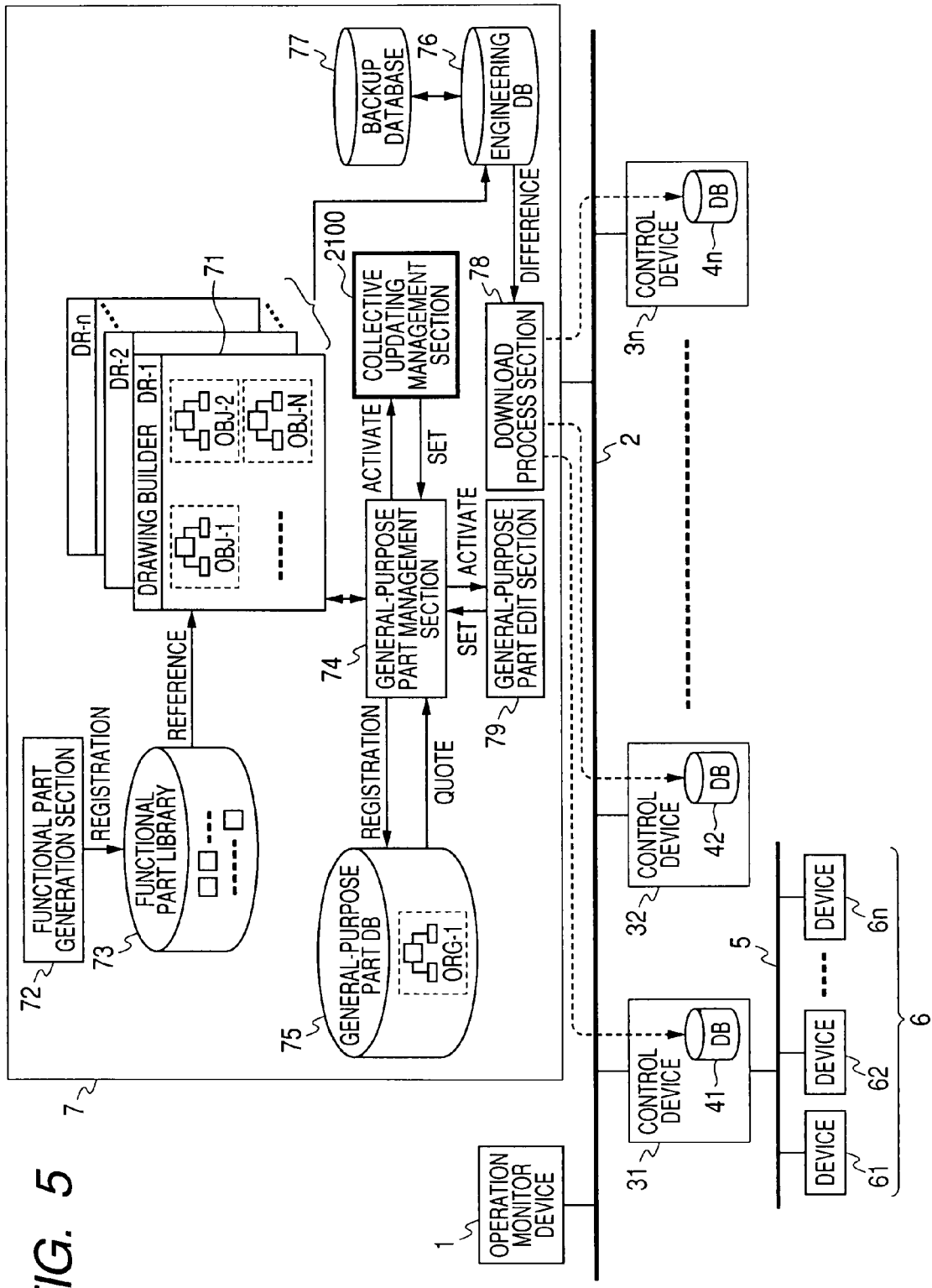
FIG. 5 is a functional block diagram showing a third exemplary embodiment of an engineering device according to the present invention which is coupled to a distributed type control system.
Figure 10:
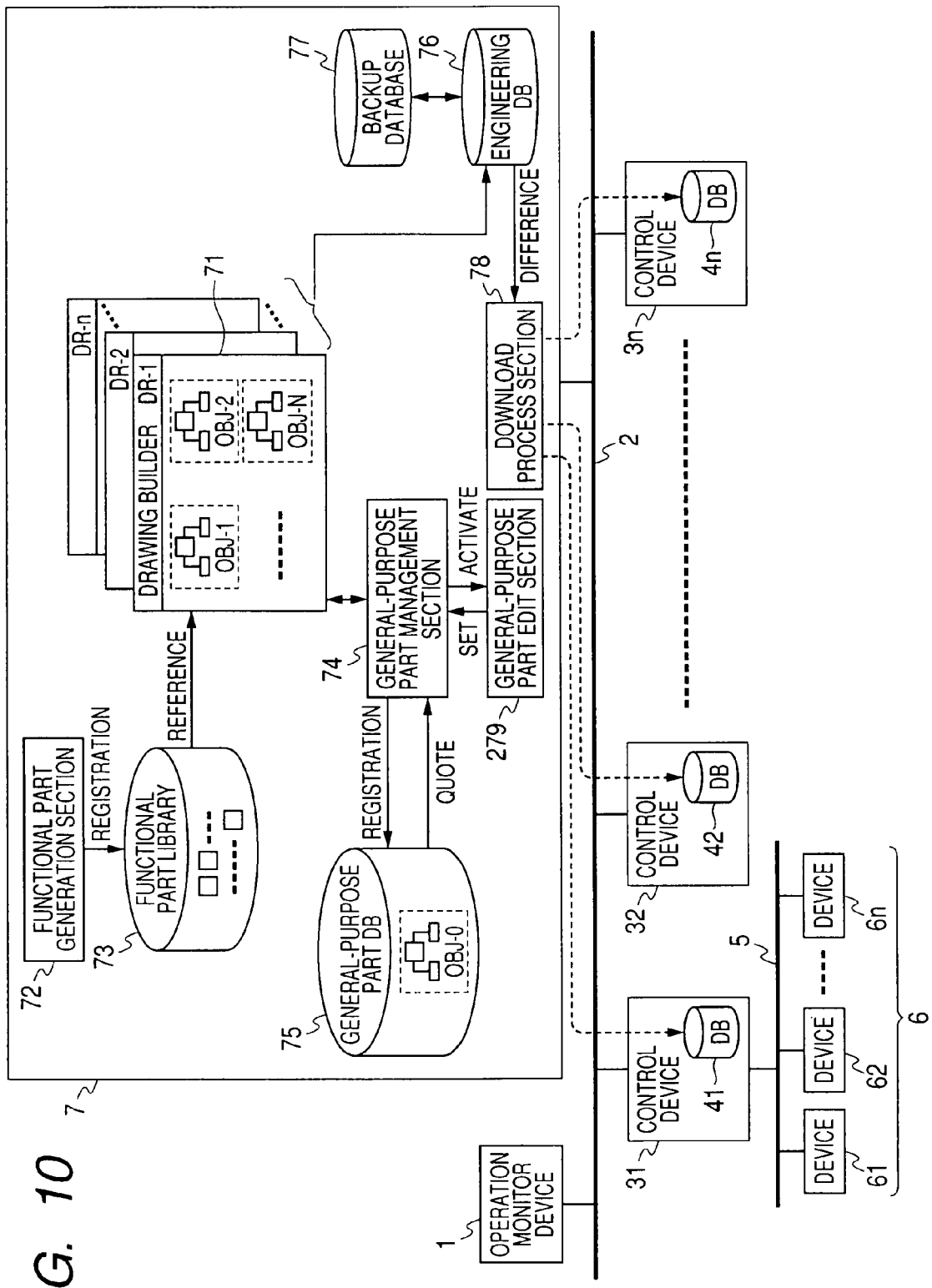
FIG. 10 is a functional block diagram showing an example of the configuration of an engineering device of a related art which is coupled to a distributed type control system.

Next, FIG. 5 is a functional block diagram showing a third exemplary embodiment of an engineering device according to the invention which is coupled to a distributed type control system. In the figure, portions identical to those of FIG. 10 are referred to by the common symbols, with explanation thereof being omitted.

The characterizing portion of the third embodiment of the present invention is a collective updating management section 2100 shown by a block of a thick line. The collective updating management section can set to allow, as to a general-purpose part being registered, the collective updating at each general-purpose part object quoting the general-purpose part by using an edit screen which is activated by a general-purpose part management section 74.

The collective updating management section 2100 includes a user interface for inputting via a screen the setting of the updating allowance at each the general-purpose part object displayed hierarchically at the lower rank of a drawing builder being displayed.

FIG. 6 is an image diagram of the display screen of the collective updating management section 2100. At the left pane of a display screen 2100a having been activated, a particular project (PJT01) as the highest rank, control devices (FCS1601, FCS1609, FCS1663) operated within the project and drawing builders (DR0001, DR0002, DR0003) used in a particular FCS (FCS1663) are displayed hierarchically.

At the right pane of the display screen 2100a, the general-purpose part objects (OBJ-1, OBJ-2, OBJ-3, OBJ-4) quoted on the drawing builder DR0001 selected at the left pane (shown by a hatching) are displayed. A check box for inputting via the screen the allowance of the collective updating is displayed at the head portion of each of the general-purpose part objects being displayed.

When the check box is set to ON, the collective updating of the corresponding general-purpose part object is allowed. The general-purpose part object not set to ON is not allowed as to the collective updating.

In the case of the figure, since the check box is set to ON as to each of the general-purpose part objects (OBJ-1, OBJ-2, OBJ-4), the collective updating is allowed as to each of these general-purpose part objects, whilst the general-purpose part object (OBJ-3) is not allowed as to the collective updating.

In the aforesaid explanation of the exemplary embodiments, as the basic function of an engineering device 7, the explanation is made as to a function of generating the control application programs executed in control devices 31, 32, - - - 3n and downloading the control application programs in the control devices. However, a function of generating a GUI program run on an operation monitor device 1 and downloading the GUI program in the operation monitor device 1 may be applied to the present invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An engineering device comprising:
    a drawing builder for generating a general-purpose part formed by combining functional parts;
    a general-purpose part managing section for registering the general-purpose part thus generated in a database and quoting the general-purpose part thus registered in the drawing builder to utilize as a general-purpose part object;

a general-purpose part object edit section for editing the registered general-purpose part object on the drawing builder; and an edit management section for setting, with respect to the general-purpose part managing section, allowance of edit at each edit item provided in the registered general-purpose part, said edit management section including a user interface for inputting via a screen a setting of the edit allowance at each item provided at a function block displayed hierarchically at a lower rank of the general-purpose part being displayed.

2. An engineering device according to claim 1, wherein the general-purpose part object edit section displays on the screen only edit data of an item allowed to be edited by the edit management section.

3. An engineering device according to claim 1, wherein a plurality of the drawing builders are provided in correspondence to control devices of a distributed type control system, and the general-purpose part object on the drawing builder is downloaded in a database of a corresponding one of the control devices as an application program executed on the corresponding control device.

4. An engineering device comprising:

a drawing builder for generating a general-purpose part formed by combining functional parts;

a general-purpose part managing section for registering the general-purpose part thus generated in a database and quoting the general-purpose part thus registered in the drawing builder to utilize as a general-purpose part object;

a general-purpose part edit section for editing the registered general-purpose part; and a collective updating management section which sets, with respect to the general-purpose part managing section, allowance of updating at every general-purpose part object utilized on the drawing builder, said collective updating management section including a user interface for inputting via a screen a setting of the updating allowed at each the general-purpose part object displayed hierarchically at a lower rank of the drawing builder being displayed.

5. An engineering device according to claim 4, wherein the general-purpose part objects on the drawing builder are updated collectively.

6. An engineering device according to claim 4, wherein a plurality of the drawing builders are provided in correspondence to control devices of a distributed type control system, and the general-purpose part object on the drawing builder is downloaded in a database of a corresponding one of the control devices as an application program executed on the corresponding control device.

* * * * *